(12) United States Patent
Lee

(10) Patent No.: US 8,169,836 B2
(45) Date of Patent: May 1, 2012

(54) BUFFER CONTROL SIGNAL GENERATION CIRCUIT AND SEMICONDUCTOR DEVICE

(75) Inventor: Yin Jae Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 330 days.

(21) Appl. No.: 12/647,669

(22) Filed: Dec. 28, 2009

(65) Prior Publication Data

US 2010/0302872 A1    Dec. 2, 2010

(30) Foreign Application Priority Data

May 28, 2009  (KR) .................. 10-2009-0047143

(51) Int. Cl.
*G11C 16/04*  (2006.01)

(52) U.S. Cl. .............. 365/189.05; 365/194; 365/233.18; 365/233.1

(58) Field of Classification Search ............. 365/189.05, 365/233.18, 194, 233.1
See application file for complete search history.

(56) References Cited

U.S. PATENT DOCUMENTS

| 7,038,953 | B2 * | 5/2006 | Aoki ................ 365/189.05 |
| 7,519,850 | B2 | 4/2009 | Bell et al. |

FOREIGN PATENT DOCUMENTS

| KR | 10-0702975 B1 | 6/2001 |
| KR | 1020010087643 A | 9/2001 |

* cited by examiner

*Primary Examiner* — David Lam
(74) *Attorney, Agent, or Firm* — Ladas & Parry LLP

(57) ABSTRACT

A buffer control signal generation circuit includes a burst start signal generator, a command decoder, a burst controller, and a burst column controller. The burst start signal generator shifts a write pulse into a first period to generate a first burst start signal and shifts the write pulse into a second period to generate a second burst start signal, such that the second period being shorter than the first period. The command decoder generates a burst period pulse and a column active pulse in response to the second burst start signal and a column control signal. The burst controller receives the column active pulse and buffers the burst period pulse to generate a burst end signal. The burst column controller generates the column control signal from the burst end signal and the column active pulse.

26 Claims, 7 Drawing Sheets

BUFFER CONTROL SIGNAL GENERATION CIRCUIT AND SEMICONDUCTOR DEVICE

CROSS-REFERENCE TO RELATED APPLICATIONS

The present application claims priority to Korean application number 10-2009-0047143, filed on May 28, 2009, which is incorporated by reference in its entirety.

BACKGROUND

This disclosure relates to a buffer control signal generation circuit.

As the development of the technology for computer systems or electronic communications steadily has evolved, semiconductor devices used for storing information have become cheaper, physically smaller, and larger with respects to data capacity. As a result, increasing demands for efficient energy consumption are being imposed on these types of semiconductor memory devices in order to cut down unnecessary current dissipation.

A general cell array layout for storing data in dynamic random access memory (DRAM) semiconductor devices is usually configured to include a plurality of memory cells coupled to word and bit lines which usually forms a web or matrix like structure. Each memory cell is usually composed of one transistor and one capacitor.

In these types of DRAM devices, when a reading operation begins, data which is stored in a memory cell is loaded into a pair of bit lines and detected/amplified by using a sense amplifier. The amplified data is then output through a data output buffer by way of local and global input/output lines. On the other hand, when a writing operation begins in these DRAM devices, data input through the data input/output buffer is loaded into a pair of bit lines through local and global input/output lines and then stored in a memory cell.

As shown in FIG. 1, a general operation of controlling the data input/output buffer used in the writing operation of the DRAM device is as follows.

First, when an external write command ECAin at a time t1 is received, then a buffer enable signal DBUF_EN is generated at a high level state at a time t2. The buffer enable signal DBUF_EN of high level state enables a buffer control signal ENDINDSB to be activated in a low level state to drive a data input buffer (not shown).

Next, if a burst operation is terminated at a time t5 and a burst period signal FYBSTN is inactivated to a low level state, a burst end signal BENDB is activated in a low level state at a time t6. As a result the buffer control signal ENDINDSB is inactivated in a high level state to stop driving the data input buffer.

Meanwhile, data DIN input through the data input buffer are all received until the time t5 in sync with strobe signals DS and DSB applied thereto in compliance with predetermined write latency.

As such, the data DIN are all input until the time t5, and the data input buffer uselessly continues to operate even until time t6.

SUMMARY

In an embodiment of this disclosure, there is provided a buffer control signal generation circuit and a semiconductor device using the circuit, capable of addressing and minimizing unnecessary power dissipation by stopping driving a data input buffer at a time of completing a data input.

In one embodiment, a buffer control signal generation circuit may include a burst start signal generator configured to shift a write pulse in a first period to generate a first burst start signal and shifting the write pulse in a second period to generate a second burst start signal, the second period being shorter than the first period, a command decoder configured to generate a burst period pulse and a column active pulse in response to the second burst start signal and a column control signal, a burst controller configured to receive the column active pulse and configured to buffer the burst period pulse to generate a burst end signal, and a burst column controller configured to generate the column control signal from the burst end signal and the column active pulse.

In another embodiment, a semiconductor device may include a buffer control signal generation circuit configured to generate a buffer control signal that is activated after a predetermined period subsequent to an input of an external write command and inactivated when a data input period set by values of write latency and burst latency, and a data buffer configured to be driven in response to the buffer control signal and receiving data in sync with a strobe signal.

BRIEF DESCRIPTION OF THE DRAWINGS

The above and other aspects, features and other advantages will be more clearly understood from the following detailed description taken in conjunction with the accompanying drawings, in which.

DESCRIPTION OF PREFERRED EMBODIMENTS

Hereinafter, embodiments of the present invention will be described with reference to accompanying drawings. However, the embodiments are for illustrative purposes only and are not intend to limit the scope of the invention.

Figure 1:
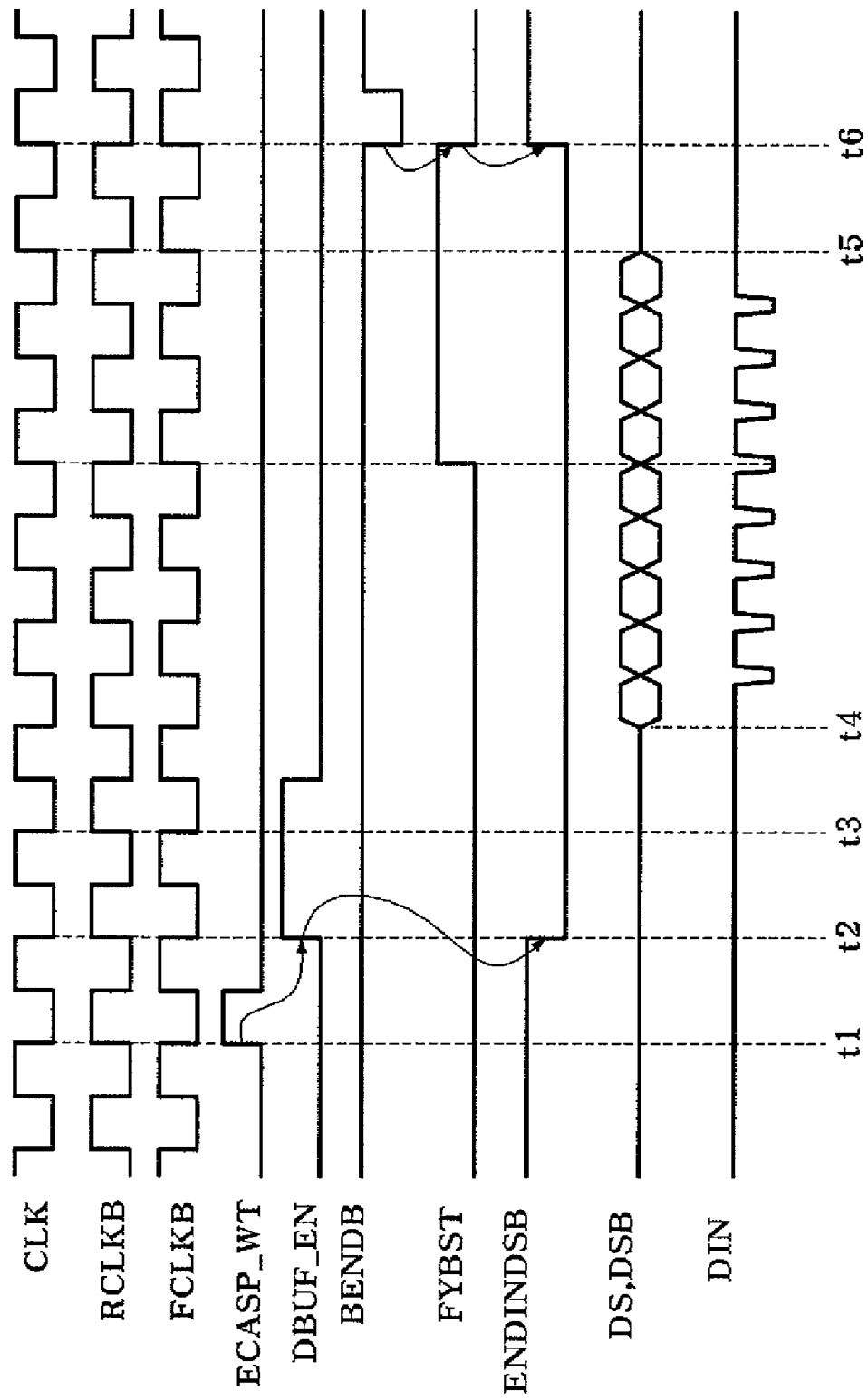
FIG. 1 is a timing diagram showing a control operation of a general data input buffer.
Figure 2:
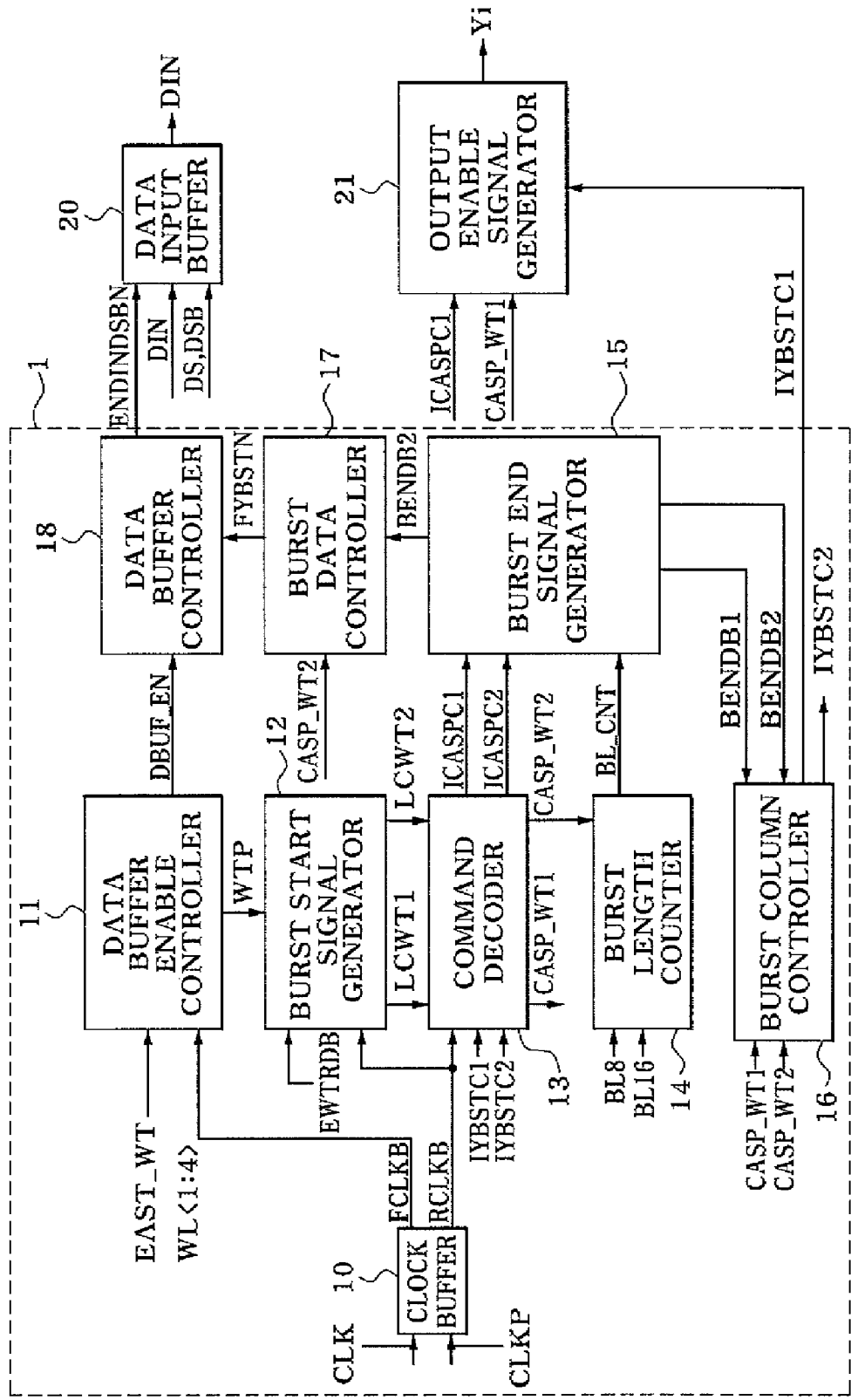
FIG. 2 is a block diagram illustrating a semiconductor device including a buffer control signal generation circuit in accordance with an embodiment of the present invention.

FIG. 2 illustrates a block configuration of a semiconductor device that includes a buffer control signal generation circuit in accordance with an embodiment of the present invention.

Referring to FIG. 2, the semiconductor device according to this embodiment includes a buffer control signal generation circuit 1, a data input buffer 20 and an output enable signal generator 21. As shown, the buffer control signal generation circuit 1 comprises a clock buffer 10, a data buffer enable controller 11, a burst start signal generator 12, a command decoder 13, a burst length counter 14, a burst end signal generator 15, a burst column controller 16, a burst data controller 17 and a data buffer controller 18.

The clock buffer 10 generates first and second internal clock signals, FCLKB and RCLKB, with respects to receiving clock signals CLK and CLKB which are externally input. In this embodiment, the first internal clock signal FCLKB is generated in sync with a falling edge of the clock signal CLK and the second internal clock signal RCLKB is generated in sync with a rising edge of the clock signal CLK.

The data buffer enable controller 11 is configured to generate a buffer enable signal DBUF_EN and a write pulse WTP in response to an external write command EAST_WT and a write latency signal WL<1:4>. In this embodiment, the buffer enable signal DBUF_EN is activated in a high level state after one cycle period of the first internal clock signal FCLKB from an input time of a pulse of the external write command EAST_WT. Further, according to this embodiment, if the write latency signal WL<2> is in a high level state (i.e., if the write latency is set to 2), then the write pulse WTP is activated after two cycle periods of the first internal clock signal FCLKB from the input time of a pulse of the external write command EAST_WT.

Figure 3:
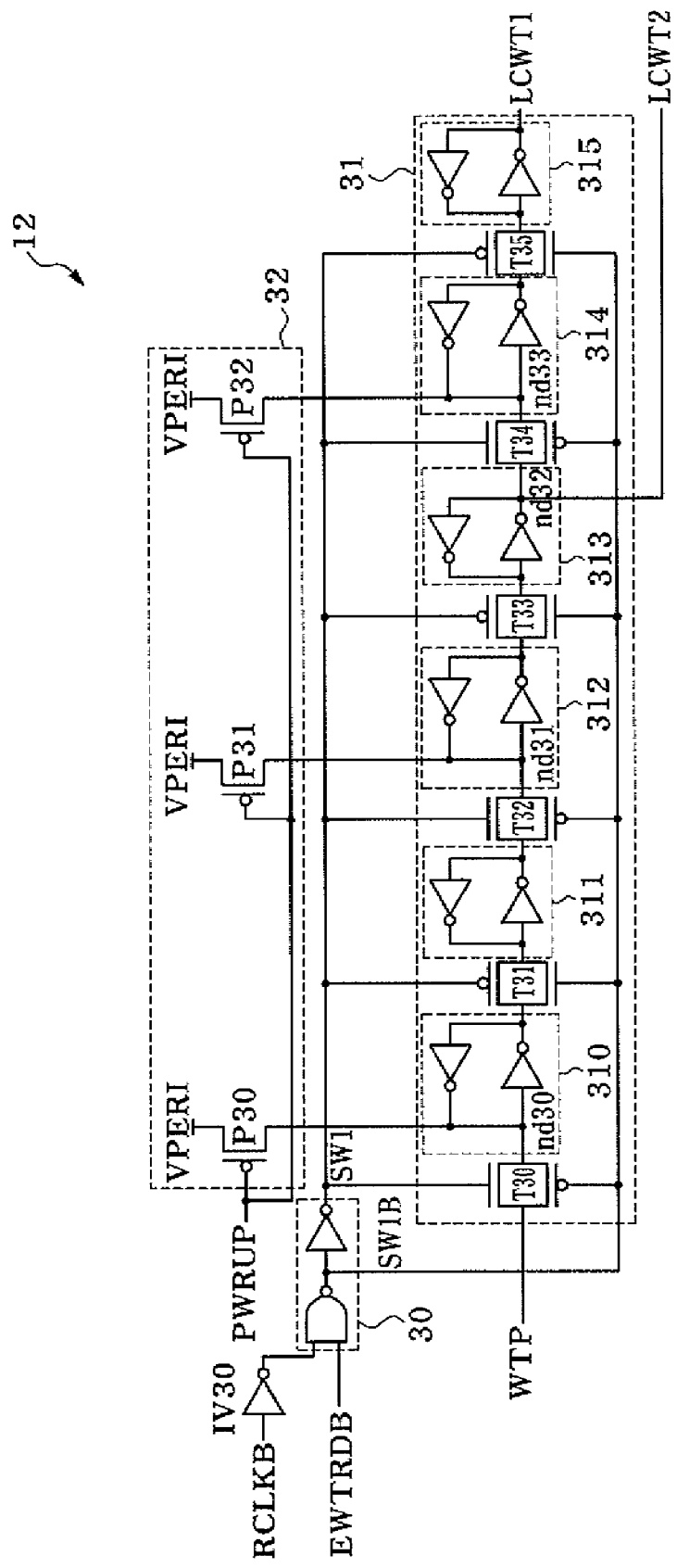
FIG. 3 is a circuit diagram illustrating a burst start signal generator included in the buffer control signal generation circuit shown in FIG. 2.

Referring now to FIG. 3, the burst start signal generator 12 is shown comprising a first switching signal generator 30, a first clock shifter 31 and an initializer 32. The first switching signal generator 30 is configured to output a first switching signal SW1 and an inverted first switching signal SW1B from an inverted signal of the second internal clock signal RCLKB and a flag signal EWTRDB. The flag signal EWTRDB is set on a low level state in a reading operation, but set on a high level state in a writing operation. With this configuration, the first switch signal generator 30 buffers the inverted signal of the second internal clock signal RCLKB and outputs the first switching signal SW1 and the inverted first switching signal SW1B.

The first clock shifter 31 is shown formed of a number of transmission gates T30~T35 and latches 310~315 which are selectively turned on in response to the first switching signal SW1 and the inverted first switching signal SW1B. With this structure, the first clock shifter 31 generates a first burst start signal LCWT1 by shifting (i.e., clock-shifting) the write pulse WTP by three cycle periods with respect to the second internal clock signal RCLKB, and generates a second burst start signal LCWT2 by shifting the write pulse WTP by two cycle periods with respect to the second internal clock signal RCLKB.

The initializer 32 is formed of a number of PMOS transistors P30~P32 powered by a perimeter supply voltage VPERI in which the transistors P30~P32 are configured to be turned on in response to a power-up signal PWRUP, initializing internal nodes, nd30, nd31 and nd32, of the first clock shifter 31 to a high level state. The power-up signal PWRUP is conditioned in a low level state during a period (hereinafter referred to as 'power-up period') before an external power source voltage VDD rises up to a predetermined level state, but the power-up signal PWRUP goes to a high level state after the power-up period.

Figure 4:
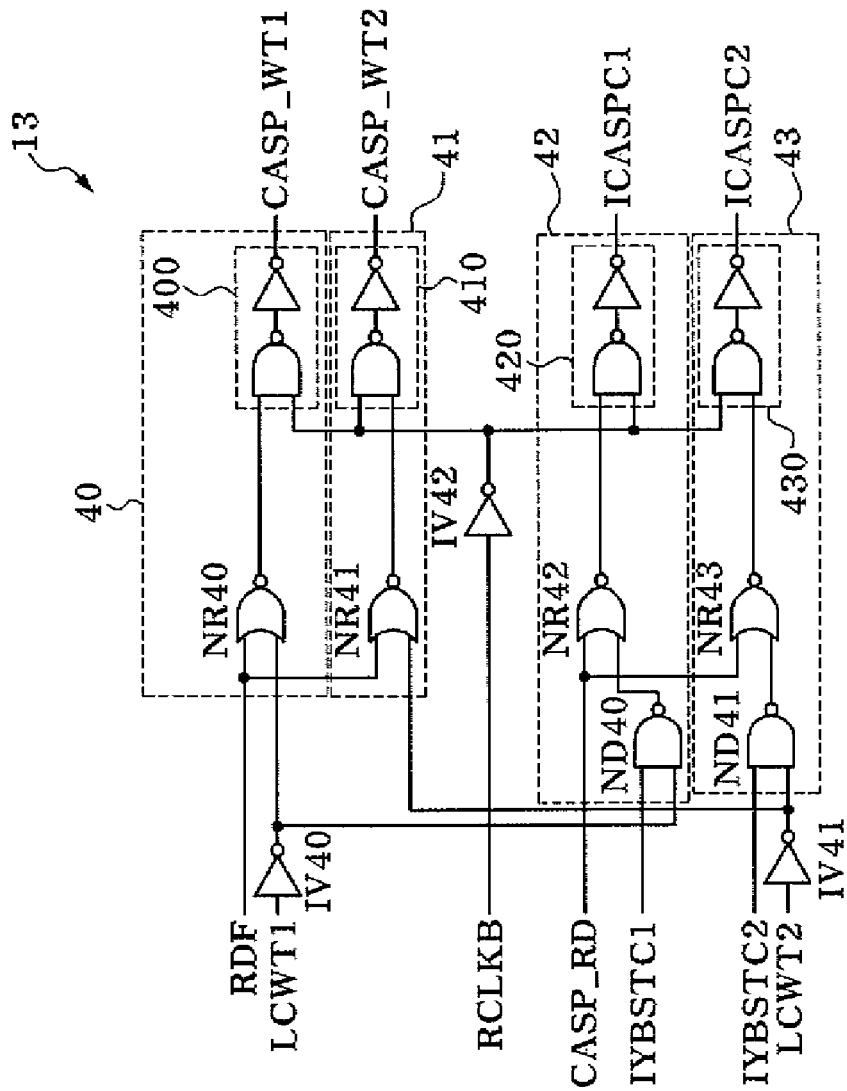
FIG. 4 is a circuit diagram illustrating a command decoder included in the buffer control signal generation circuit shown in FIG. 2.

Referring to FIG. 4, the command decoder 13 is shown to include a first pulse generator 40, a second pulse generator 41, a third pulse generator 42 and a fourth pulse generator 43.

The first pulse generator 40 is shown to comprise a NOR gate NR40 and a logic circuit 400. The NOR gate NR40 is configured to execute a not-OR operation with a read flag signal RDF and an inverted signal of the burst start signal LCWT1. The logic circuit 400 is configured to execute an AND operation with the inverted signal of the second internal clock signal RCLKB and an output signal of the NOR gate NR40. Here, the read flag signal RDF is set on a high level state in the reading operation, but the read flag signal RDF is set on a low level state in the writing operation. With this configuration, the first pulse generator 40 buffers the inverted signal of the second internal clock signal RCLKB in a period when the first burst start signal LCWT1 is set on a high level state, during the writing operation, and outputs a first column active pulse CASP_WT1.

The second pulse generator 41 is shown comprising a NOR gate NR41 and a logic circuit 410. The NOR gate NR41 is configured to executing a not-OR operation with the read flag signal RDF and an inverted signal of the burst start signal LCWT1. The logic circuit 410 is configured to execute an AND operation with the inverted signal of the second internal clock signal RCLKB and an output signal of the NOR gate NR41. With this configuration, the second pulse generator 41 buffers the inverted signal of the second internal clock signal RCLKB in the period when the first burst start signal LCWT1 is set on a high level state, during the writing operation, and outputs a second column active pulse CASP_WT2.

The third pulse generator 42 is shown comprising a NAND gate ND40, a NOR gate NR42, and a logic circuit 420. The NAND gate ND40 is configured to execute a not-AND operation with the inverted signal of the first burst start signal LCWT1 and a first column control signal IYBSTC1. The NOR gate NR42 is configured to execute a not-OR operating with a read column active pulse CASP_RD and an output signal of the NAND gate ND40. The logic circuit 420 is configured to execute an AND operation with the inverted signal of the second internal clock signal RCLKB and an output signal of the NOR gate NR42. Here, the read column active pulse CASP_RD is applied to the command decoder in a high level state when a read command is input for the reading operation. With this configuration, the third pulse generator 42 buffers the inverted signal of the second internal clock signal RCLKB in a period when the first burst start signal LCWT1 is set on a low level state and the first column control signal IYBSTC1 is set on a high level state, during the writing operation, and outputs a first burst period pulse ICASPC1.

The fourth pulse generator 43 is shown comprising a NAND gate ND41, a NOR gate NR43, and a logic circuit 430. The NAND gate ND41 is configured to execute a not-AND operation with an inverted signal of the second burst start signal LCWT2 and a second column control signal IYBSTC2. The NOR gate NR43 is configured to execute a not-OR operating with the read column active pulse CASP_RD and an output signal of the NAND gate ND41. The logic circuit 430 is configured to execute an AND operation with the inverted signal of the second internal clock signal RCLKB and an output signal of the NOR gate NR43. With this configuration, the fourth pulse generator 43 buffers the inverted signal of the second internal clock signal RCLKB in a period when the second burst start signal LCWT2 is set on a low level state and the second column control signal IYBSTC2 is set on a high level state, during the writing operation, and outputs a second burst period pulse ICASPC2.

The burst length counter 14 generates a burst counting signal BL_CNT in response to the second column active pulse CASP_WT2 in accordance to a first burst signal BL8 and a second burst signal BL16. Here, the first burst signal BL8 is set on a high level state if the burst length is determined to be 8. The second burst signal BL16 is set on a high level state if the burst length is determined to be 16. If the first burst signal BL8 is set to a high level state, the burst length counter 14 generates the burst counting signal BL_CNT at a high level state activated after two cycle periods of the second internal clock signal RCLKB subsequent to an input of the second column active pulse CASP_WT2. Otherwise, if the second burst signal BL16 is set to a high level state, the burst length counter 14 generates the burst counting signal BL_CNT at a high level state activated after four cycle periods of the second internal clock signal RCLKB subsequent to an input of the second column active pulse CASP_WT2.

Figure 5:
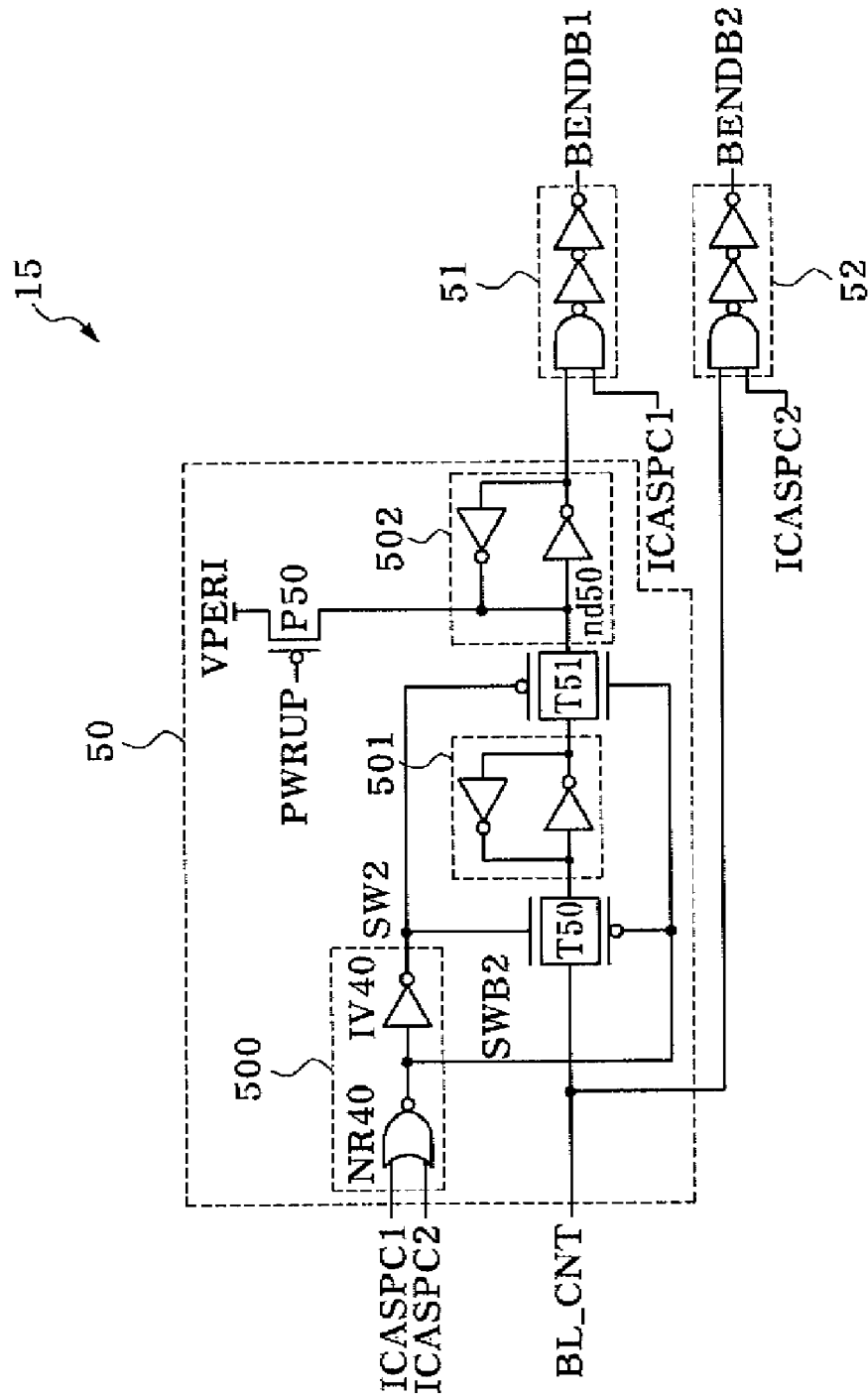
FIG. 5 is a circuit diagram illustrating a burst end signal generator included in the buffer control signal generation circuit shown in FIG. 2.

The burst end signal generator 15, referring to FIG. 5, is shown comprising a second clock shifter 50, a first inversion buffer 51 and a second inversion buffer 52. The second clock shifter 50 is formed of a second switching signal generator 500 configured to generate a second switching signal SW2 and an inverted second switching signal SW2B from the first burst period pulse ICASPC1 and the second burst period pulse ICASPC2, transmission gates T50 and T51 alternatively turned on in response to the second switching signal SW2 and the inverted second switching signal SW2B, latches 501 and 502 coupled to the transmission gates T50 and T51, and a P-type metal-oxide-semiconductor (PMOS) transistor P50 initializing a node nd50 to a high level state in response to the power-up signal. With this configuration, the second clock shifter 50 operates to shift the burst counting signal BL_CNT in one cycle period of the second internal clock signal RCLKB while the first and second burst period pulses ICASPC1 and ICASPC2 are toggled (i.e., oscillating).

Figure 6:
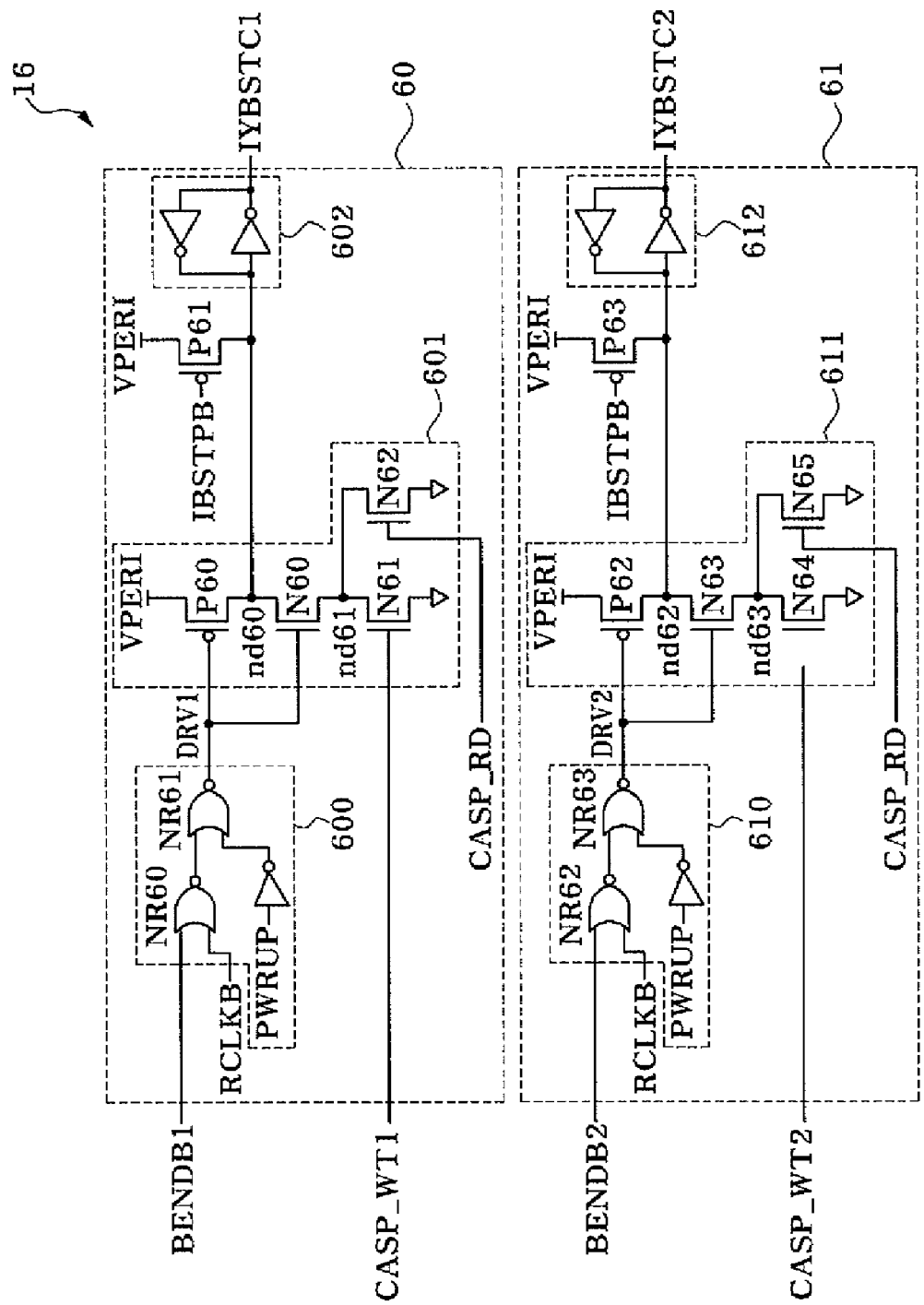
FIG. 6 is a circuit diagram illustrating a burst column controller included in the buffer control signal generation circuit shown in FIG. 2.

The first inversion buffer 51 inversely buffers the first burst period pulse ICASPC1 and generates a first burst end signal BENDB1 in response to an output signal of the second clock shifter 50. The second inversion buffer 52 inversely buffers the second burst period pulse ICASPC2 and generates a second burst end signal BENDB2 in response to the burst counting signal BL_CNT. Here, the first burst end signal BENDB1 is generated as a clock-shifted signal later than the second burst end signal BENDB2 in one cycle period of the second internal clock signal RCLKB. The burst column controller 16, referring to FIG. 6, is formed of a first burst column controller 60 and a second burst column controller 61.

The first burst column controller 60 is shown comprising a first drive signal generator 600, a first driver 601, a PMOS transistor P61 and a latch 602. The first drive signal generator 600 is formed of a NOR gate NR60 executing a not-OR operation with the first burst end signal BENDB1 and the second internal clock signal RCLKB, and a NOR gate NR61 generating a first drive signal DRV1 by executing a not-OR operation with an inverted signal of the power-up signal PWRUP and an output signal of the NOR gate NR60. The first driver 601 is formed of a PMOS transistor P60 as a pull-up element operating to pull up a node nd60, an NMOS transistor N60 as a pull-down element connected between the node nd60 and a node nd61 and turned on in response to the first drive signal DRV1, an NMOS transistor N61 as another pull-down element connected between the node nd61 and the ground voltage VSS and turned on in response to the first column active pulse CASP_WT1, and an NMOS transistor N62 as another pull-down element connected between the node nd61 and the ground voltage VSS and turned on in response to the read column active pulse CASP_RD. The PMOS transistor P61 pulls up the node nd60 in response to an interrupt signal IBSTPB that is activated in a low level state when there is an input of an interrupt command.

With this organization, the first burst column controller 60 generates the first column control signal IYBSTC1 that is set to be active from an input of the first column active pulse CASP_WT1 until the first burst end signal BENDB1 is inactivated.

The second burst column controller 61 is shown comprising a second drive signal generator 610, a second driver 611, a PMOS transistor P63 and a latch 612. The second drive signal generator 610 is formed of a NOR gate NR62 executing a not-OR operation with the second burst end signal BENDB2 and the second internal clock signal RCLKB, and a NOR gate NR63 generating a second drive signal DRV2 by executing a not-OR operation with the inverted signal of the power-up signal PWRUP and an output signal of the NOR gate NR62. The second driver 61 is formed of a PMOS transistor P62 as a pull-up element operating to pull up a node nd62, an NMOS transistor N63 as a pull-down element connected between the node nd62 and a node nd63 and turned on in response to the second drive signal DRV2, an NMOS transistor N64 as another pull-down element connected between the node nd63 and the ground voltage VSS and turned on in response to the second column active pulse CASP_WT2, and an NMOS transistor N65 as another pull-down element connected between the node nd63 and the ground voltage VSS and turned on in response to the read column active pulse CASP_RD. The PMOS transistor P63 pulls up the node nd60 in response to the interrupt signal IBSTPB.

With this organization, the second burst column controller 61 generates the second column control signal IYBSTC2 that is set to be in an active mode from an input of the second column active pulse CASP_WT2 until the second burst end signal BENDB2 is inactivated.

The burst data controller 17 generates the burst period signal FYBSTN, which is active during a burst period, from the second column active pulse CASP_WT2 and the second burst end signal BENDB2. The burst period signal FTBSTN retains a high level state from an input of the second active pulse CASP_WT2 until activation of the second burst end signal BENDB2.

The data buffer controller 18 receives the buffer enable signal DBUF_EN and the burst period signal FTBSTN and a buffer control signal ENDINDSBN for controlling the data input buffer 20. The buffer control signal ENDINDSBN is in an active mode when in a low level state from when the buffer enable signal DBUF_EN goes to a high level state until the burst period signal FYBSTN downs to a low level state by termination of the burst period.

The data input buffer 20 is driven in response to the buffer control signal ENDINDSBN and receives data DIN in sync with the strobe signals DS and DSB.

The output enable signal generator 21 generates an output enable signal Yi from the first burst period pulse ICASPC1 and the first column active pulse CASP_WT1. The output enable signal Yi functions to turn on a switch (not shown) connected between a bit line and a segmented bit line.

Figure 7:
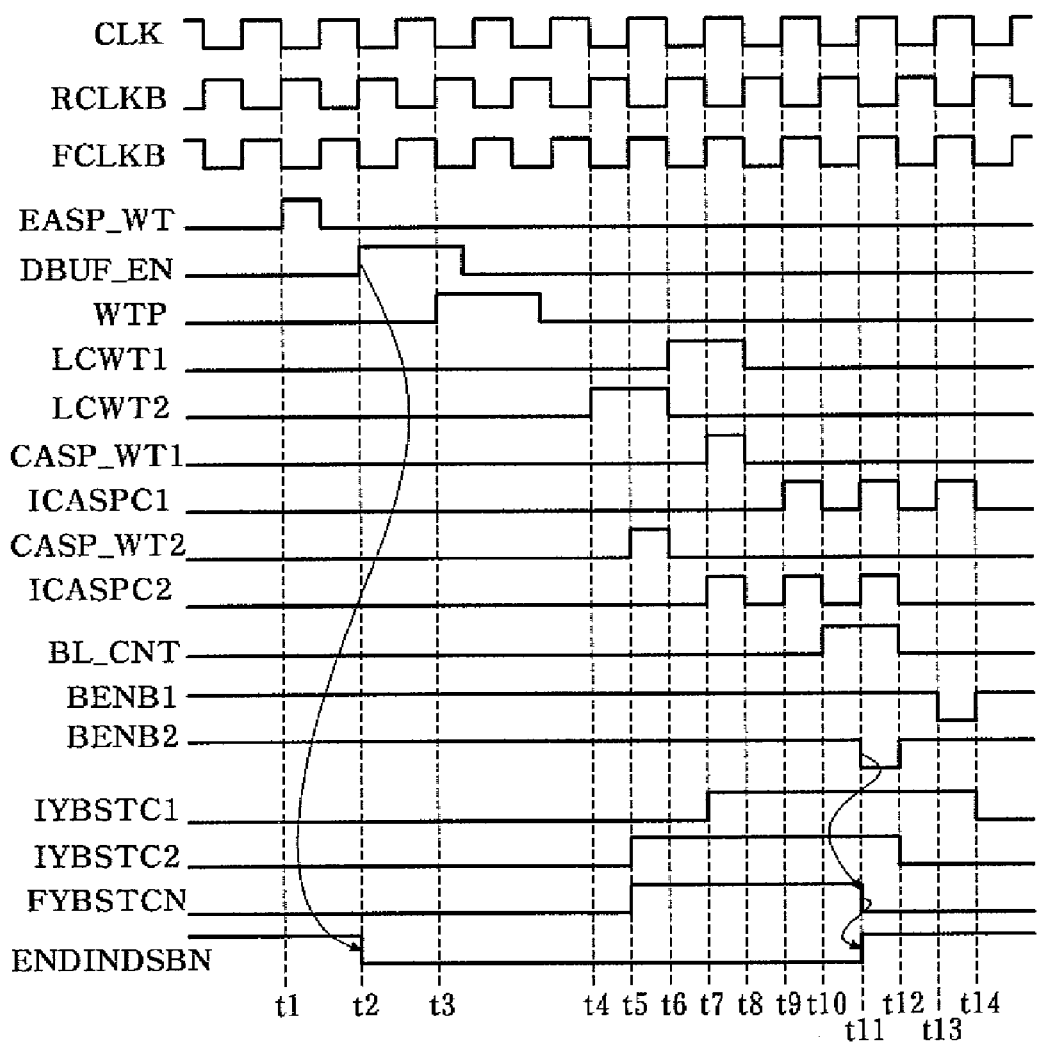
FIG. 7 is a timing diagram showing an operation of the semiconductor device including the buffer control signal generation circuit of FIG. 2.

Now the semiconductor device including the buffer control signal generation circuit configured as stated above will be described hereinafter in conjunction with the timing sequence shown in FIG. 7, exemplarily assuming that the write latency is set to 2 and the burst length is set to 8.

First, the clock buffer 10 externally receives the clock signals CLK and CLKB and generates the first internal clock signal FCLKB in sync with a falling edge of the clock signal CLK while the clock buffer 10 also generates the second internal clock signal RCLKB in sync with a rising edge of the clock signal CLKB. As the write latency is set to 2, the data buffer enable controller 11 generates the buffer enable signal DBUF_EN activate to a high level state at a time t2 after one cycle period of the first internal clock signal FCLKB from a time t1 at which a pulse of the external write command EAST_WT is applied to the semiconductor device. If the buffer enable signal DBUF is activated in a high level state, the data buffer controller 18 enables the data input buffer 20 by generating the buffer control signal ENDINDSBN that is activated to a low level state. The data buffer enable controller 11 further generates the write pulse WTP activated to a high level state at a time t3 after two cycle periods of the first internal clock signal FCLKB from the time t1 of inputting the pulse of the external write command EAST_WT.

Next, the burst start signal generator 12 shifts the write pulse WTP to be later in three cycle periods of the second internal clock signal RCLKB and generates the first burst start signal LCWT1, and shifts the write pulse WTP to be later in two cycle periods of the second internal clock signal RCLKB and generates the second burst start signal LCWT2. Thus, the first burst start signal LCWT1 is activated in a high level state at a time t6 and the second burst start signal LCWT2 is activated in a high level state at a time t4. Here, the clock shifting duration may be variable by embodiments according to the present invention.

The command decoder 13 outputs the first column active pulse CASP_WT1 by buffering the inverted signal of the second internal clock signal RCLKB while the first burst start signal LCWT1 is set on a high level state in the writing operation, and outputs the second column active pulse CASP_WT2 by buffering the inverted signal of the second internal clock signal RCLKB while the second burst start signal LCWT2 is set on a high level state in the writing operation. Thus, the first column active pulse CASP_WT1 is set to be in an active mode when in a high level state from a time t7 until a time t8 and the second column active pulse CASP_WT2 is set to be in an active mode when in a high level state from a time t5 until a time t6. Additionally, the command decoder 13 outputs the first burst period pulse ICASPC1 by buffering the inverted signal of the second internal clock signal RCLKB, while the first burst start signal LCWT1 is set on a low level state and the first column control signal IYBSTC1 is set on a low level state, in the writing operation, and outputs the second burst period pulse ICASPC2 by buffering the inverted signal of the second internal clock signal RCLKB, while the second burst start signal LCWT2 is set on a low level state and the second column control signal IYBSTC2 is set on a low level state. Thus, the first burst period pulse ICASPC1 is generated with three pulses oscillating from a time t9 until a time t14 and the second burst period pulse ICASPC2 is generated with three pulses oscillating from the time t7 until a time t12.

As the burst length is set to 8, the burst length counter 14 generates the burst counting signal BL_CNT that is activated at a time t10 after two cycle periods of the second internal clock signal RCLKB from the time t6 of inputting the second column active pulse CASP_WT2.

The burst end signal generator 15 operates to generate the second burst end signal BENDB2 by inversely buffering the second burst period pulse ICASPC2 while the burst counting signal BL_CNT is set to be in an active mode when in a high level state. Thus, the second burst period pulse BENDB2 is set to be in an active mode when in a low level state from a time t11 until the time t12. The burst end signal generator 15 also generates the first burst end signal BENDB1 by inversely buffering the first burst period pulse ICASPC1 at a time after one cycle period of the second internal clock signal RCLKB from when the burst counting signal BL_CNT is activated to a high level state. Therefore, the first burst end signal BENDB1 is set to be in an active mode when in a low level state from a time t13 until the time t14.

The burst column controller 16 generates the first column control signal IYBSTC1 that is set to be in an active mode when in a high level state from the time t7 of inputting the first column active pulse CASP_WT1 until the time t14 at which the first burst end signal BENDB1 is inactivated. Further, the burst column controller 16 generates the second column control signal IYBSTC2 that is set to be in an active mode when in a high level state from the time t5 of inputting the second column active pulse CASP_WT2 until the time t12 at which the second burst end signal BENDB2 is inactivated.

The burst data controller 17 receives the second column active pulse CASP_WT2 and the second burst end signal BENDB2, and generates the burst period signal FYBSTN that is set to be in an active mode during the burst period, i.e., from the time t5 of inputting the second column active pulse CASP_WT2 until the time t11 at which the second burst end signal BENDB2 is activated.

The data buffer controller 18 receives the burst period signal FYBSTN activated in a high level state and inactivates the buffer control signal ENDINDSBN, which has been activated in a low level state, by the buffer enable signal DBUF_EN of high level state, to a high level state.

As described above, in the semiconductor device according to embodiments of the present invention, the data input buffer 20 is interrupted in operation by inactivating the buffer control signal ENDINDSBN to a high level state at the time t11 at which an input of the data DIN is complete. Therefore, the semiconductor device according to the present invention is effective in preventing or at least minimizing some of the unnecessary power dissipation by stopping driving the data input buffer 20 in one cycle period, i.e., from t11 until t13 (refer to the prior case that this period is needlessly consuming power), of the clock signal CLK after an input of the data DIN.

While the present invention has been described with respect to the specific embodiments, it will be apparent to those skilled in the art that various changes and modifications may be made without departing from the spirit and scope of the invention as defined in the following claims.

What is claimed is:

1. A buffer control signal generation circuit, comprising:
a burst start signal generator configured to delay a write pulse, by a first period, to generate a first burst start signal and to delay the write pulse, by a second period, to generate a second burst start signal, wherein the second period is shorter than the first period;
a command decoder configured to generate a burst period pulse and a column active pulse in response to the second burst start signal and a column control signal;
a burst controller configured to receive the column active pulse and to generate a burst end signal by delaying the burst period pulse; and
a burst column controller configured to generate the column control signal from the burst end signal and the column active pulse.

2. The buffer control signal generation circuit of claim 1, wherein the burst controller comprises:
a burst length counter configured to generate a burst counting signal from the received column active pulse in accordance with a burst length signal that corresponds to a burst length; and
a burst end signal generator configured to delay the burst period pulse to generate the burst end signal in response to receiving the burst counting signal.

3. The buffer control signal generation circuit of claim 2, wherein the burst length counter generates the burst counting signal after two cycle periods of an internal clock signal subsequent to an input of the column active pulse when the burst length is 8, and the burst length counter generates the burst counting signal after four cycle periods of the internal clock signal subsequent to the input of the column active pulse when the burst length is 16.

4. The buffer control signal generation circuit of claim 2, wherein the burst end signal generator outputs the burst end signal by inverting the burst period pulse while the burst counting signal is in an active mode.

5. The buffer control signal generation circuit of claim 1, wherein the burst start signal generator comprises:
   a switching signal generator configured to buffer an internal clock signal to generate a switching signal in response to a flag signal; and
   a clock shifter configured to comprise at least a transmission gate turned on in response to the switching signal and delay the write pulse in the first and second periods to generate respectively the first and second burst start signals.

6. The buffer control signal generation circuit of claim 5, wherein the second period is shorter than the first period by an integer timing cycle of the internal clock signal.

7. The buffer control signal generation circuit of claim 1, wherein the command decoder comprises:
   a first pulse generator configured to buffer an internal clock signal by generating the column active pulse in response to the first burst start signal; and
   a second pulse generator configured to buffer the internal clock signal by generating the burst period pulse in response to the column control signal and the second burst start signal.

8. The buffer control signal generation circuit of claim 7, wherein the first pulse generator comprises:
   a logic element configured to execute a logical operation using a read flag signal and the second burst start signal; and
   a logic circuit configured to execute a logical operation with an output signal of the logic gate and a buffered signal of the internal clock signal and to generate the column active pulse.

9. The buffer control signal generation circuit of claim 7, wherein the second pulse generator comprises:
   a first logic element configured to execute a logical operation using the column control signal and a buffered signal of the second burst start signal;
   a second logic element configured to execute a logical operation using an output signal of the first logic element and a read column active pulse; and
   a logic circuit configured to execute a logical operation using an output signal of the second logic element and a buffered signal of the internal clock signal and to generate the burst period pulse.

10. The buffer control signal generation circuit of claim 1, wherein the burst column controller comprises:
    a drive signal generator configured to buffer an internal clock signal to generate a drive signal in response to the burst end signal; and
    a driver configured to drive an output node in response to the drive signal and the column active pulse.

11. The buffer control signal generation circuit of claim 10, wherein the drive signal generator comprises:
    a first logic element configured to execute a logical operation using the burst end signal and the internal clock signal; and
    a second logic element configured to execute a logical operation using an output signal of the first logic element and a buffered signal of a power-up signal.

12. The buffer control signal generation circuit of claim 10, wherein the driver comprises:

a pull-up element configured to pull up the output node in response to the drive signal;
a first pull-down element configured to be turned on in response to the drive signal; and
a second pull-down element configured to be turned on in response to the column active pulse.

13. The buffer control signal generation circuit of claim 1, further comprising:
    a data buffer enable controller configured to generate a buffer enable signal activated after a predetermined period subsequent to an input of an external write command, and the write pulse activated after a period set by a write latency value subsequent to the input of the external write command;
    a burst data controller configured to generate a burst period signal, which is in an active mode during a burst period, from the burst end signal and the column active pulse; and
    a data buffer controller configured to generate a buffer control signal, which controls a data input buffer, in response to the buffer enable signal and the burst period signal.

14. A semiconductor device, comprising:
    a buffer control signal generation circuit configured to generate a buffer control signal that is activated after a predetermined period subsequent to an input of an external write command and inactivated when a data input period set by values of write latency and burst latency; and
    a data buffer configured to be driven in response to the buffer control signal and receiving data in sync with a strobe signal.

15. The semiconductor device of claim 14, wherein the buffer control signal generation circuit comprises:
    a burst start signal generator configured to shift a write pulse in a first period to generate a first burst start signal and configured to shift the write pulse in a second period to generate a second burst start signal, wherein the second period is shorter than the first period;
    a command decoder configured to generate first and second burst period pulses and first and second column active pulses in response to the first and second burst start signals and first and second column control signals;
    a burst length counter configured to generate a burst counting signal from the second column active pulse in accordance to a burst length;
    a burst end signal generator configured to generate first and second burst end signals from the burst counting signal and the first and second burst period pulses; and
    a burst column controller configured to generate the first and second column control signals from the first and second burst end signals and the first and second column active pulses.

16. The semiconductor device of claim 15, wherein the burst start signal generator comprises:
    a switching signal generator configured to buffer an internal clock signal to generate a switching signal in response to a flag signal; and
    a clock shifter configured to comprise at least a transmission gate turned on in response to the switching signal and configured to shift the write pulse in the first and second periods respectively to generate the first and second burst start signals.

17. The semiconductor device of claim 16, wherein the second period is shorter than the first period by an integer cycle time period of the internal clock signal.

18. The semiconductor device of claim 15, wherein the command decoder comprises:
- a first pulse generator configured to buffer an internal clock signal to generate the first column active pulse in response to the first burst start signal;
- a second pulse generator configured to buffer the internal clock signal to generate the second column active pulse in response to the second burst start signal;
- a third pulse generator configured to buffer the internal clock signal to generate the first burst period pulse in response to the first column control signal and the first burst start signal; and
- a fourth pulse generator configured to buffer the internal clock signal to generate the second burst start pulse in response to the second column control signal and the second burst start signal.

19. The semiconductor device of claim 18, wherein the first pulse generator comprises:
- a logic element configured to execute a logical operation using a read flag signal and a buffered signal of the second burst start signal; and
- a logic circuit configured to execute a logical operation using an output signal of the logic gate and a buffered signal of the internal clock signal and to generate the second column active pulse.

20. The semiconductor device of claim 18, wherein the fourth pulse generator comprises:
- a first logic element configured to execute a logical operation using the second column control signal and a buffered signal of the second burst start signal;
- a second logic element configured to execute a logical operation using an output signal of the first logic element and a read column active pulse; and
- a logic circuit configured to execute a logical operation using an output signal of the second logic element and a buffered signal of the internal clock signal and to generate the second burst period pulse.

21. The semiconductor device of claim 15, wherein the burst length counter generates the burst counting signal after two cycle periods of an internal clock signal subsequent to an input of the second column active pulse when the burst length is 8, and generates the burst counting signal after four cycle periods of the internal clock signal subsequent to the input of the second column active pulse when the burst length is 16.

22. The semiconductor device of claim 15, wherein the burst end signal generator comprises:
- a clock shifter configured to delay the burst counting signal in response to first and second burst period pulses;
- a first inversion buffer configured to generate the first burst end signal by buffering the first burst period pulse in response to an output signal of the clock shifter; and
- a second inversion buffer configured to generate the second burst end signal by buffering the second burst period pulse in response to burst counting signal.

23. The semiconductor device of claim 22, wherein the clock shifter comprises:
- a switching signal generator configured to generate a switching signal from the first and second burst period pulses; and
- first and second transmission gates alternatively configured to be turned on in response to the switching signal.

24. The semiconductor device of claim 15, wherein the burst column controller comprises:
- a first burst column controller configured to generate the first column control signal that is in an active mode from an input of the first column active pulse until a pulse of the first burst end signal is completely input; and
- a second burst column controller configured to generate the second column control signal that is in an active mode from an input of the second column active pulse until a pulse of the second burst end signal is completely input.

25. The semiconductor device of claim 15, wherein the buffer control signal generation circuit further comprises:
- a data buffer enable controller configured to generate a buffer enable signal activated after a predetermined period subsequent to an input of an external write command, and the write pulse activated after a period set by a write latency value subsequent to the input of the external write command;
- a burst data controller configured to generate a burst period signal, which is in an active mode during a burst period, from the second burst end signal and the second column active pulse; and
- a data buffer controller configured to generate a buffer control signal, which controls a data input buffer, in response to the buffer enable signal and the burst period signal.

26. The semiconductor device of claim 15, further comprising:
- an output enable signal generator configured to receive the first burst period pulse, the first column active pulse and the first column control signal and to generate an output enable signal to turn on a switch connected between a bit line and an input/output line.

* * * * *